US012620995B2

(12) United States Patent
Mikhemar et al.

(10) Patent No.: US 12,620,995 B2
(45) Date of Patent: May 5, 2026

(54) HD3 CANCELLATION TECHNIQUE IN RF DACS AND DIGITAL TRANSMITTERS

(71) Applicant: Avago Technologies International Sales Pte. Limited, Singapore (SG)

(72) Inventors: Mohyee Mikhemar, Aliso Viejo, CA (US); Alvin Lin Lai, Andover, MA (US); Arya Behzad, Los Altos, CA (US); Wei-Hong Chen, Irvine, CA (US); Ahmed Sayed Hamza, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 232 days.

(21) Appl. No.: 18/132,910

(22) Filed: Apr. 10, 2023

(65) Prior Publication Data

US 2024/0340018 A1      Oct. 10, 2024

(51) Int. Cl.
*H03M 1/06* (2006.01)
*H04L 27/00* (2006.01)

(52) U.S. Cl.
CPC ...... *H03M 1/0614* (2013.01); *H04L 27/0014* (2013.01); *H04L 2027/0016* (2013.01)

(58) Field of Classification Search
CPC ............. H03M 1/0614; H04L 27/0014; H04L 2027/0016
See application file for complete search history.

(56) References Cited

U.S. PATENT DOCUMENTS

| 10,171,034 B2 | 1/2019 | Tseng et al. | |
| 10,333,763 B1 * | 6/2019 | Jiang | H04L 27/20 |
| 10,630,239 B1 * | 4/2020 | Mittal | H03K 3/017 |
| 2018/0302111 A1 * | 10/2018 | Chen | H04B 1/525 |
| 2022/0191866 A1 | 6/2022 | Chang | |
| 2024/0146503 A1 * | 5/2024 | Beikmirza | H04B 1/0042 |
| 2024/0186948 A1 * | 6/2024 | Myoung | H03D 7/1466 |

OTHER PUBLICATIONS

Chen Yen-Horng et al: 11 9.7 An LTE SAW-less transmitter using 33% duty-cycle LO signals for harmonic suppression, 2015 IEEE International Solid-State Circuits Conference—(ISSCC) Digest of Technical Papers, IEEE, Feb. 22, 2015 (Feb. 22, 2015), pp. 1-3, XP032748323, DOI: 10.1109/ISSCC.2015.7062981 ISBN: 978-1-4799-6223-5 [retrieved on Mar. 17, 2015] Title * p. 172, left-hand column, paragraph 2 figures 9.7.2-9.7.4 *.
Foreign Search Report on non-Foley case related to U.S. Appl. No. 18/132,910 DTD Sep. 18, 2024.

(Continued)

*Primary Examiner* — David B Lugo
(74) *Attorney, Agent, or Firm* — Foley & Lardner LLP

(57) ABSTRACT

A transmitter includes a first circuit to generate multiphase pulses, and a second circuit to mix a set of in-phase (I) data and quadrature (Q) data with the multiphase pulses and to generate an output radiofrequency (RF) signal. The multiple pulses include multiple I pulses and multiple Q pulses each comprising a pulse that includes a duty cycle such that a first null appears at a third harmonic frequency in a frequency spectrum of the pulse.

14 Claims, 7 Drawing Sheets

100

(56)         References Cited

OTHER PUBLICATIONS

Jiang Hong et al: "A 660 MHz-5 GHz 6-Phase/3-Phase Transmitter With Cancellation of Counter-Intermodulation Distortion and Improved Image Rejection", IEEE Transactions On Circuits and Systems I: Regular Papers, IEEE, US, vol. 68, No. 4, Jan. 14, 2021 (Jan. 14, 2021), pp. 1432-1443, XP011843433, ISSN: 1549-8328, DOI: 10.1109/TCSI.2020.3048639 [retrieved on Mar. 4, 2021] Section I, last paragraph* * Section II, first paragraph* * Section II.A * * figures 3,4,5, 12 *.

Tsai Ming-Da et al: 10.6 A 4G/5G Cellular Transmitter in 12nm FinFET with Harmonic Rejection, 2020 IEEE International Solid-State Circuits Conference—(ISSCC), IEEE, Feb. 16, 2020 (Feb. 16, 2020), pp. 182-184, XP033754535, DOI: 10.1109/ISSCC19947.2020.9063145 [retrieved on Apr. 9, 2020] Title* p. 182, left-hand column paragraph 4 * p. 184, right-hand column paragraph 2 * figures 10.6.1-10.6.3 *.

* cited by examiner

400B

Mag

420

1/T_pw  2/T_pw  3/T_pw  4/T_pw  Freq

400A

410

T_pw

T_LO

400C

| Duty Cycle | 25% | 33.3% | 50% |
|---|---|---|---|
| First Null freq | $4*f_{LO}$ | $3*f_{LO}$ | $2*f_{LO}$ |

500

510

Mag $0$    $1f_{LO}$    $2f_{LO}$    $3f_{LO}$    $4f_{LO}$    Feq

600

610 Generate a set of multiphase local oscillator (LO) pulses

620 Mix a set of digital input data with the set of multiphase LO pulses

630 Adjust a duty cycle of each pulse of the set of four-phase LO pulses to produce a null at the third harmonic frequency in a corresponding frequency spectrum of that pulse of the set of multiphase LO pulses

HD3 CANCELLATION TECHNIQUE IN RF DACS AND DIGITAL TRANSMITTERS

TECHNICAL FIELD

The present description relates generally to radio frequency (RF) communications including, for example, third harmonic distortion (HD3) cancellation techniques in RF digital-to-analog converters (DACs) and digital transmitters.

BACKGROUND

Harmonic distortion (HD) is common in electronic circuits such as amplifiers, modulators, and other circuits due to a non-ideal transfer function such as nonlinearity. This can cause a portion of the output-signal power to appear at frequencies which are multiples of the frequency of the input signal. For example, the HD3 is the distortion due to output-signal components appearing at three times the frequency of the input signal. Additionally, distortion that can happen during modulation of a signal is a third counter intermodulation (CIM3), which creates a product that lands at three times the signal frequency ($3f_{sig}$) on the other side of the local oscillator (LO) frequency ($f_{LO}$), that is at a frequency of $f_{LO}-3f_{sig}$.

Existing techniques for countering HD3 and CIM3 include using 8-phase clocking or applying inductor-capacitor (LC) filters tuned at a frequency of $3f_{LO}$. These techniques, although may work for their intended purposes, have shortcomings such as high-power consumption and large chip area (due to large inductors).

BRIEF DESCRIPTION OF THE DRAWINGS

Certain features of the subject technology are set forth in the appended claims.

However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

According to some aspects, the subject technology is directed to an HD3 cancellation technique in RF DACs and digital transmitters. The HD3 cancellation technique of the subject technology uses multiphase clock pulses with a duty cycle adjusted to produce a zero at the third harmonic frequency in a corresponding frequency spectrum of the clock pulse. In some embodiments, the duty cycle of a clock pulse is a ratio of the clock pulse width to a period (inverse of frequency) of the clock pulse. For example, a clock pulse with a frequency of 1 KHz (1 mS period) and a pulse width of 500 μS has a duty cycle of 50% (0.5/1=0.50) In one or more embodiments, the multiphase clock pulses include a set of four-phase clock pulses. In some embodiments, the duty cycle of the four-phase clock pulses can be 33% or 50%. In some aspects, when boosting the output power of the digital transmitter can be achieved without a high level of CIM3 rejection, the four-phase clock pulses with 50% duty cycle can be used to cancel HD3.

The disclosed cancellation technique can achieve about 20 decibels (dB) rejection of the HD3 and CIM3, similar to the existing techniques that use LC filters tuned at 3 $f_{LO}$. However, the disclosed technique is implemented with a considerably smaller footprint because it does not need large inductors as used in the LC filters. Furthermore, the disclosed cancellation technique consumes about 10-50% lower power as compared to the existing 8-phase clocking technique.

Figure 1:
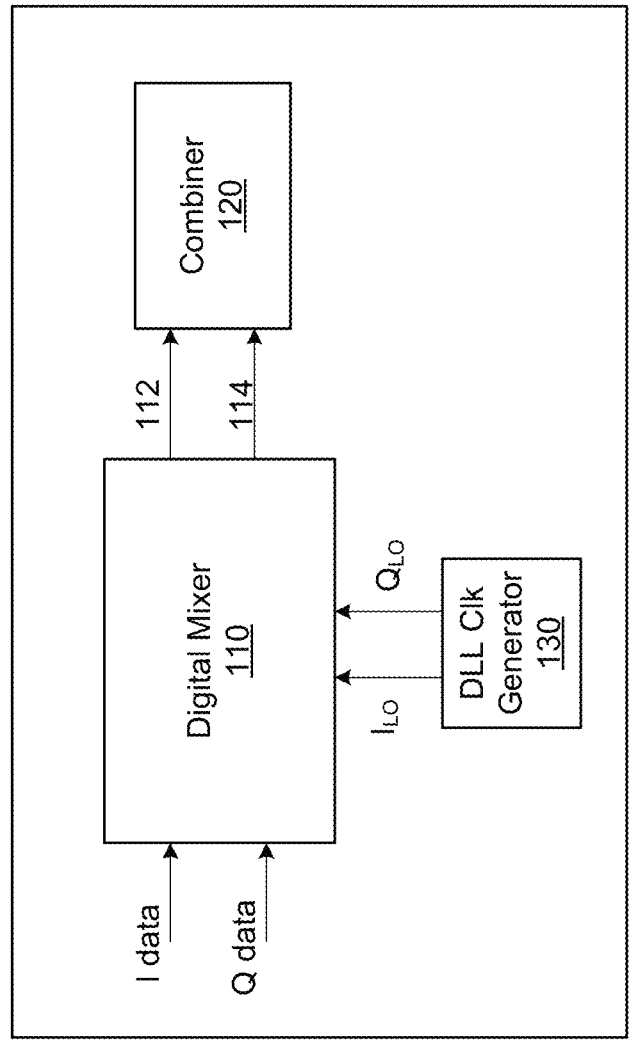
FIG. 1 is a high-level block diagram illustrating an example of a digital transmitter within which some aspects of the subject technology are implemented.

FIG. 1 is a high-level block diagram illustrating an example of a digital transmitter 100 within which some aspects of the subject technology are implemented. The digital transmitter 100 is an integrated circuit including, but not limited to, a digital mixer circuit 110, a digital clock generator circuit 130, and a combiner circuit 120. In some embodiments, the digital mixer circuit 110 is an I and Q mixer that receives a set of digital input data and a set of multi-phase LO pulses. In some embodiments, the set of digital input data includes digital I and Q data. In one or more embodiments, the set of multi-phase LO pulses include four-phase $I_{LO}$ and $Q_{LO}$ pulses, which are generated by the digital clock generator circuit 130. In some embodiments, the digital mixer circuit 110 uses the set of four-phase LO pulses to improve HD3 and CIM3.

In some embodiments, the digital clock generator circuit 130 is an LO generator and can be implemented by a DLL circuit, as described in more details herein. In some embodiments, the LO generator generates the set of four-phase LO pulses with adjustable duty cycles. In some embodiments, the digital mixer circuit 110 mixes the set of input data with the set of four-phase LO pulses. In some embodiments, the LO generator can adjust the adjustable duty cycles to a predetermined value that causes a first null of a frequency spectrum of a pulse of the set of multiphase LO pulses to occur at a third harmonic frequency. In some embodiments, the predetermined value is about 33%, which enables improvement of the HD3 in the range of 17 to 23 dB (e.g., about 20 dB). In some embodiments, the predetermined value is about 50%, which improves both HD3 and CIM3 more moderately.

The digital mixer circuit 110 produces analog I signals 112 and analog Q signals 114 that are combined by the combiner circuit 120 for delivery, for example, to a power amplifier for amplification or to an RF antenna for transmission. In some embodiments, the combiner circuit 120 can be an analog combiner such as a transformer.

In some embodiments, the four-phase $I_{Lo}$ and $Q_{LO}$ pulses have a duty cycle of 33% or 50%. The application of the 33% duty cycle warrants about 20 dB rejection of both HD3 and CIM3. However, using the four-phase $I_{Lo}$ and $Q_{LO}$ pulses with 50% duty cycle, while rejecting the HD3 by 20 dB, may not quite achieve that level of rejection for the CIM3. The rejection of the second HD (HD2) and fourth HD (HD4) can be achieved by using existing techniques.

Figures 2A, 2B, 2C:
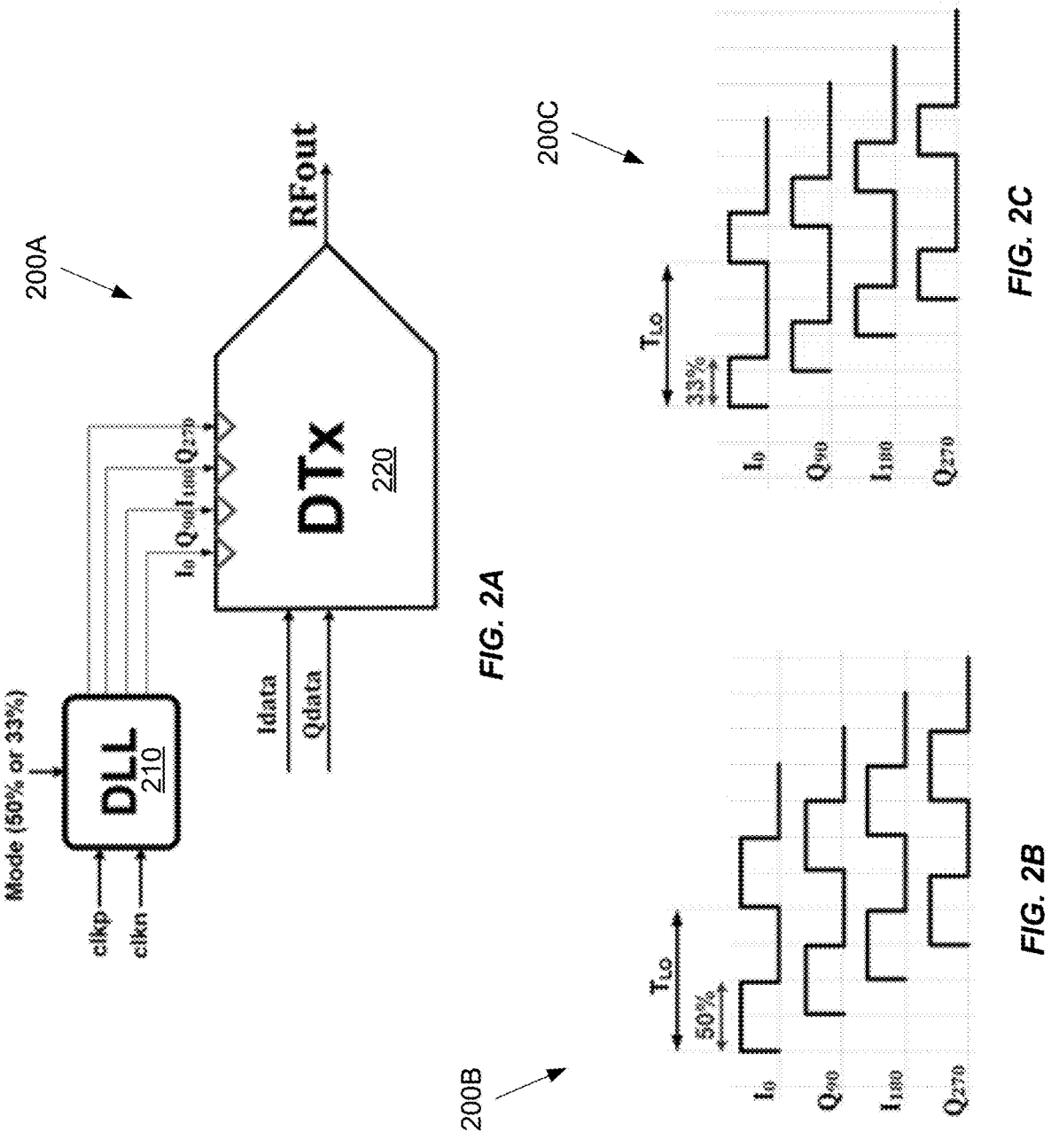
FIGS. 2A, 2B, and 2C are a schematic diagram illustrating an example of a delay locked loop (DLL) providing clock signals for a digital transmitter (DTX) and corresponding charts depicting clock signals, according to aspects of the subject technology.

FIG. 2A is a schematic diagram illustrating a system 200A with a DLL 210 providing clock signals for a digital transmitter (DTX) 220, according to aspects of the subject technology. FIGS. 2B and 2C are corresponding charts depicting a clock signal 200B and a clock signal 200C, respectively, according to aspects of the subject technology. The DLL 210 is a circuit including a delay line, a phase detector, and a loop filter, not shown for simplicity. The delay line generates a delay that can be adjusted by a control signal. The phase detector can sense a phase difference, and the loop filter provides the signal to control the delay line according to the sensed difference. In some embodiments, the DLL 210 is a compact and low-power DLL and receives positive clock (clkp) and negative clock (clkn) signals and generates a set of multiphase LO pulses, for example, a set of four I and Q clock signals with different phases, which are also referred to as of four-phase LO pulses. In some embodiments, the four I and Q clock signals can have successive 90-degree phase differences. For example, the four I and Q clock signals shown in FIG. 2A are an I-clock with 0-degree phase ($I_0$), a Q-clock with 90-degree phase ($Q_{90}$), an I-clock with 180-degree phase ($I_{180}$), and a Q-clock with 270-degree phase ($Q_{270}$).

In some embodiment, the DLL 210 prepares the set of multiphase LO pulses, for example, four-phase LO pulses, with adjustable duty cycle, which can be adjusted to produce adjusted duty cycles, for instance, of about 33% or 50%. By adjusting the duty cycle of the LO pulses, the DLL 210 enables improvement of the HD3 and CIM3. The digital DTX 220 receives digital I-data and Q-data inputs, which are processed using the four I and Q clock signals to produce a digital RF output signal (RFout).

FIG. 2B shows four I and Q clock pulses ($I_0$, $Q_{90}$, $I_{180}$, and $Q_{270}$) with a duty cycle of 50% and respective 90 degrees phase difference. The duty cycle of 50% means that the ON time of each clock pulse (e.g., LO) is 50% of the period ($T_{LO}$) of the clock pulse.

FIG. 2C shows four I and Q clock pulses ($I_0$, $Q_{90}$, $I_{180}$, and $Q_{270}$) with a duty cycle of 33% and respective 90° phase difference. The duty cycle of 33% means that the ON time of each clock pulse (e.g., LO) is 33% of the period ($T_{LO}$) of the clock pulse.

In some embodiments, the subject technology applies 33% duty cycle, which warrants about 20 dB rejection of both HD3 and CIM3. However, using the four clock pulses with 50% duty cycle, while rejecting the HD3 by 20 dB, may not quite achieve that level of rejection for the CIM3.

Figure 3B:
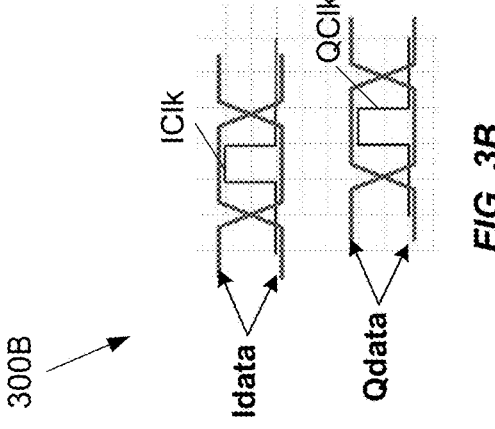
FIGS. 3A, 3B, 3C, and 3D illustrate a schematic diagram of an example implementation of in-phase (I) and quadrature (Q) mixer and examples of input, output, and four-phase pulses.
Figure 3D:
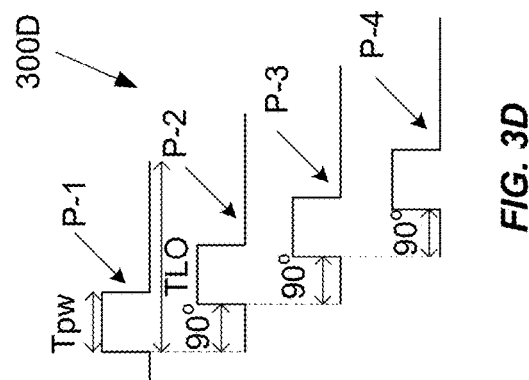
Figure 3A:
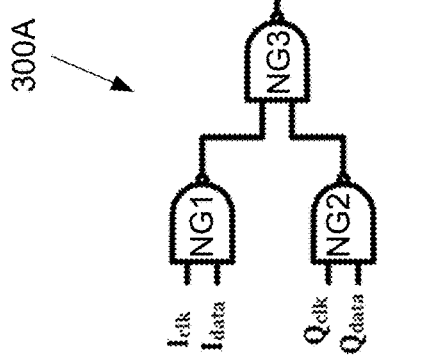
Figure 3C:
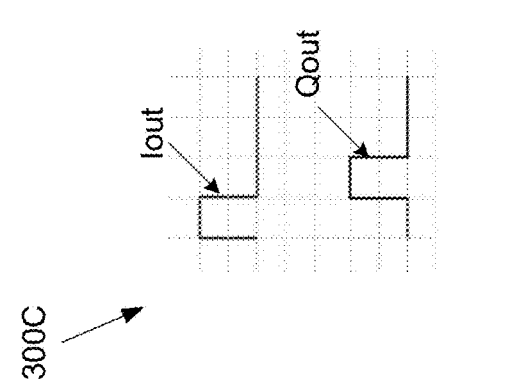

FIG. 3A illustrate a schematic diagram of an example implementation 300A of an I and Q mixer (e.g., digital mixer circuit 110 of FIG. 1). FIGS. 3B, 3C, and 3D illustrate plots 300B, 300C, and 300D, respectively, of examples of input, output, and four-phase pulses, respectively. The example implementation 300A of the I and Q mixer is a digital implementation using NAND gates NG1, NG2, and NG3. I-data ($I_{data}$) and I-clock ($I_{clk}$) are used as inputs to the first NAND gate NG1 and Q-data ($Q_{data}$) and Q-clock ($Q_{clk}$) are used as inputs to the second NAND gate NG2, and the outputs of NAND gates NG1 and NG2 are applied to inputs of the third NAND gate NG3 to generate a digital RF output signal.

The plot 300B shows I and Q input pulses $I_{data}$ and $Q_{data}$, which can take values of 1 or 0, and the I and Q clock pulses Ick and $Q_{clk}$ which have a 90° phase shift with respect to one another.

The plot 300C depicts the I and Q output data Iout and $Q_{out}$ for the case when both $I_{data}$ and $Q_{data}$ are logic 1. The Iout and $Q_{out}$ pulses also have a phase difference of 90°, as expected.

The plot 300D illustrates four LO pulses P-1, P-2, P-3, and P-4 of a set of four-phase LO pulses of the subject technology. The LO pulses P-1, P-2, P-3, and P-4, as shown in FIG. 3D, have 90° phase shift with respect to one another. In some embodiments, each of the LO pulses P-1, P-2, P-3, and P-4 have a duty cycle ($T_{pw}/T_{LO}$) of about 33%, which when applied to the DTX (e.g., DTX 220 of FIG. 2A) of the subject technology warrants HD3 and CIM3 rejection at the level of about 20 dB. In one or more embodiments, a duty cycle of 50% can be used if boosting of the output power of the digital transmitter can be achieved without lower levels of CIM3 rejection.

Figure 4B:
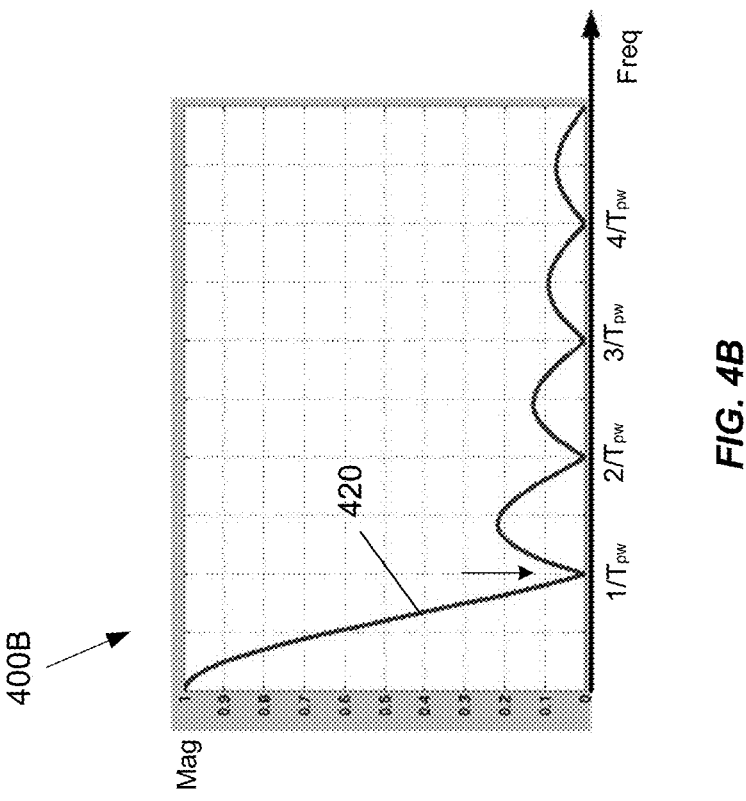
FIGS. 4A, 4B, and 4C are charts illustrating an example LO pulse and the corresponding frequency spectrum and a duty cycle table.
Figure 4A:
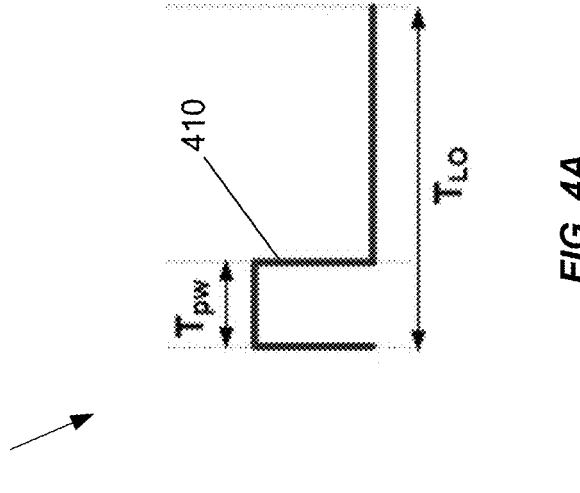
Figures 4C, 5:
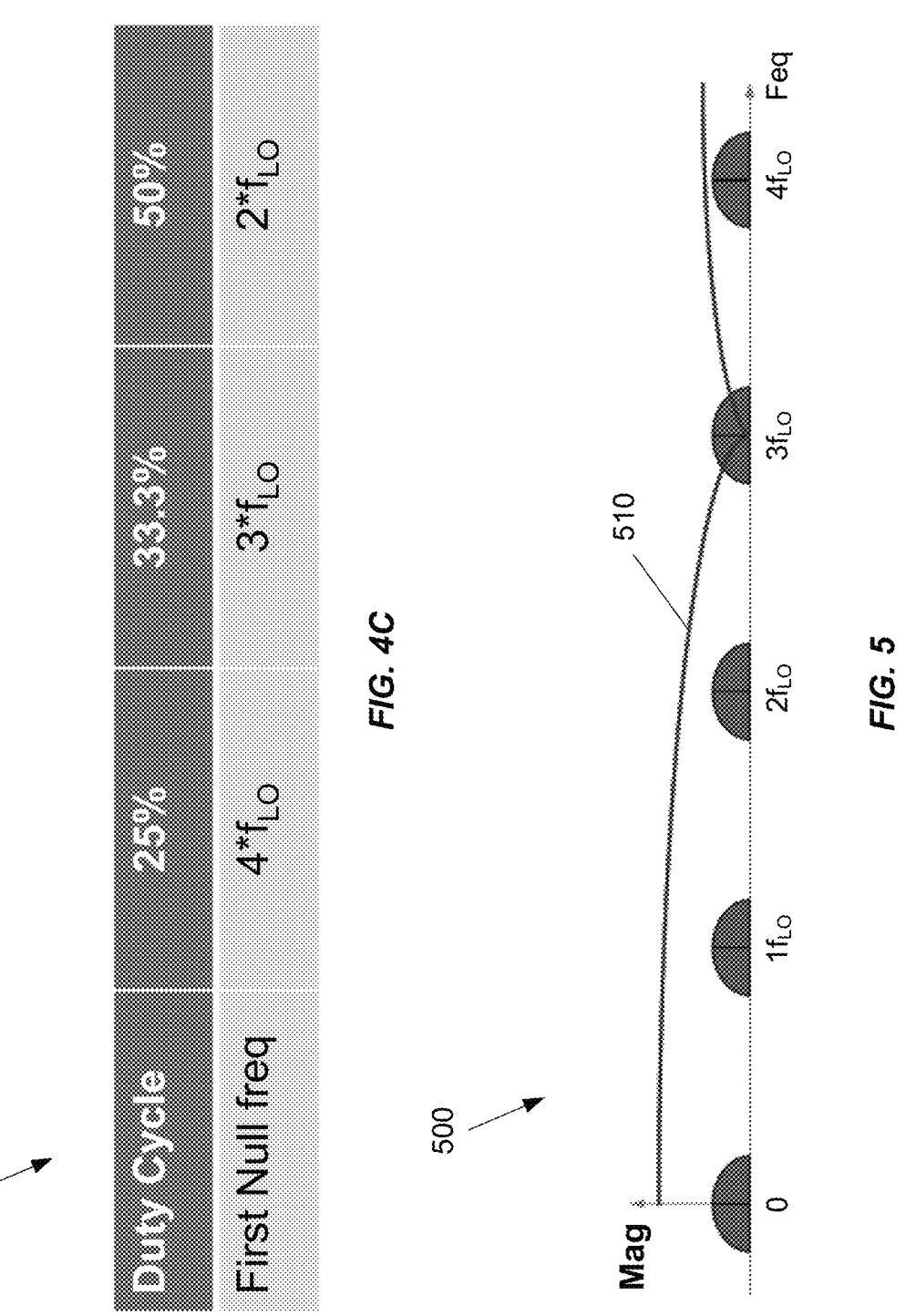
FIG. 5 is a chart illustrating an example of an output frequency spectrum associated with using four-phase clock pules with 33% duty cycle.

FIGS. 4A and 4B show a charge 400A and a chart 400B, respectively, illustrating an example LO pulse. FIG. 4C shows a duty cycle table 400C with a corresponding frequency spectrum. The LO pulse 410 have a pulse with $T_{pw}$ and a period of $T_{LO}$. In some embodiments, the duty cycle defined by: duty cycle=$T_{pw}/T_{LO}$=$T_{pw}$ $f_{LO}$, which gives: $1/T_{pw}$=$f_{LO}$/duty_cycle, where $f_{LO}$ is the frequency of LO pulses. The duty cycle is adjusted to about 33% to achieve DH3 and CIM rejection of about 20 dB.

The frequency spectrum 420 corresponds to the LO pulse 410 and depicts a plot of a normalized magnitude versus frequency. The frequency spectrum 420 shows nulls (zeros) at frequencies of $1/T_{pw}$, $2/T_{pw}$, $3/T_{pw}$, and $4/T_{pw}$. The first null at $1/T_{pw}$ correspond to about 33% duty cycle, which is used in the disclosed technique and is associated with sampling at 3 $f_{LO}$, as shown in the duty cycle table 400C.

The duty cycle table 400C shows frequencies at which the first null occurs in the frequency spectrum of the digital TX for different duty cycle values. For example, the first null occurs at 3*$f_{Lo}$ for a duty cycle of 33.3%, where $f_{Lo}$ is the LO frequency ($f_{LO}$=1/$T_{LO}$). This is the basis for using a sampling rate of 3*$f_{Lo}$ and a duty cycle of about 33% in the HD3 and CIM3 rejection technique of the subject technology.

FIG. 5 is a chart 500 illustrating an example of a frequency spectrum 510 associated with a set of four-phase clock pules with 33% duty cycle (e.g., plot 300D of FIG. 3D). The input signal is sampled at 3*$f_{Lo}$ rate, and the first null in the frequency spectrum 510 is occurring at 3*$f_{LO}$, as discussed above with respect to the duty cycle table 400C. This mode of operation is used to improve CIM3 for a one source unit (1RU) case. The four-phase 33% duty cycle LO used by the subject technology rejects the DH3 by about 20 dB and the CIM3 by more than 6 dB.

Figure 6:
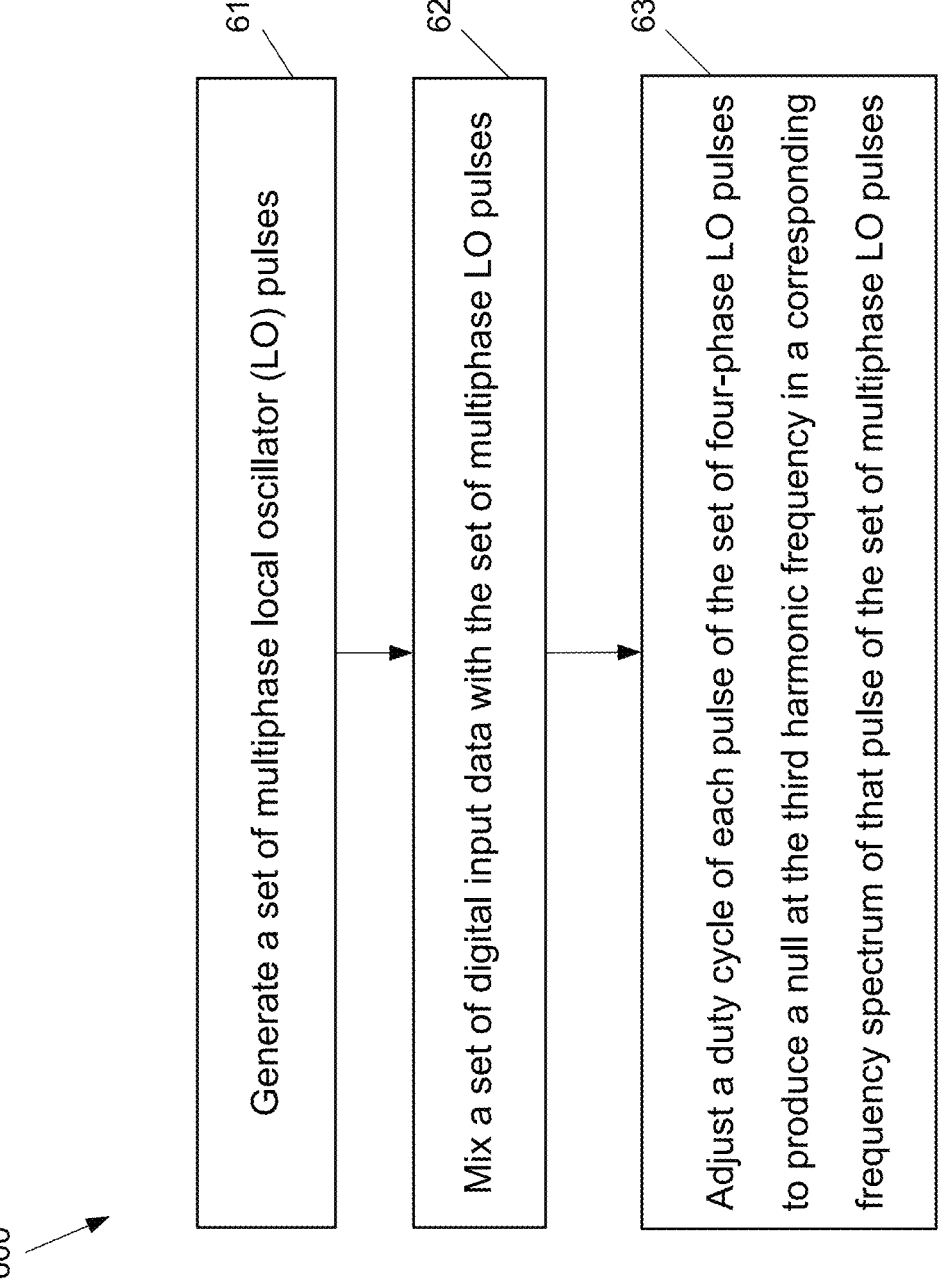
FIG. 6 is a flow diagram illustrating an example of a process for cancelling HD3 and CMI3, according to aspects of the subject technology.

FIG. 6 is a flow diagram illustrating an example of a process 600 for cancelling HD3 and CMI3, according to aspects of the subject technology. The process 600 includes generating (e.g., by using the DLL 210 of FIG. 2A) a set of multiphase LO pulses (e.g., 200B of FIG. 2B) (block 610) and mixing a set of digital input data (e.g., $I_{data}$ of FIG. 2C) with the set of multiphase LO pulses (block 620). The method further includes adjusting (e.g., by using the DLL 210 of FIG. 2A) a duty cycle of each pulse of the set of four-phase LO pulses to produce a null at the third harmonic frequency in a corresponding frequency spectrum of that pulse of the set of multiphase LO pulses (block 630).

Figure 7:
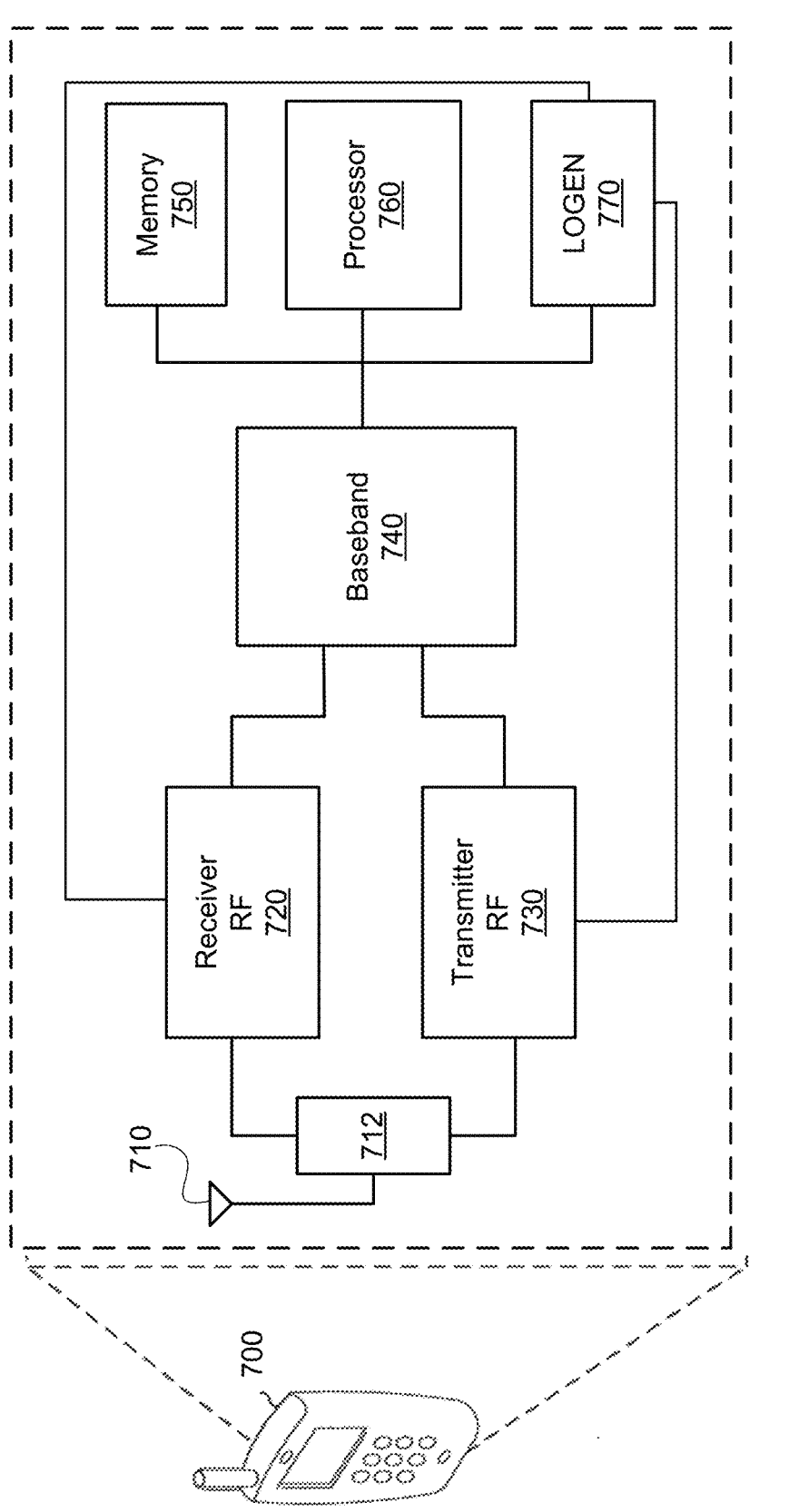
FIG. 7 illustrates an example of a wireless communication device within which some aspects of the subject technology are implemented.

FIG. 7 illustrates an example of a wireless communication device 700 within which some aspects of the subject technology are implemented. In one or more implementations, the wireless communication device 700 can be a tablet, a smartphone, a smartwatch, or other electronic device that can benefit from the HD3 rejection technique of the subject technology. The wireless communication device 700 may comprise an RF antenna 710, a duplexer 712, a receiver 720, a transmitter 730, a baseband processing module 740, a memory 750, a processor 760, and a local oscillator generator (LOGEN) 770. In various aspects of the subject technology, one or more of the blocks represented in FIG. 7 may be integrated on one or more semiconductor substrates. For example, blocks 720-770 may be realized in a single chip, a single system on a chip, or in a multichip chipset.

The receiver 720 may comprise suitable logic circuitry and/or code that may be operable to receive and process signals from the RF antenna 710. The receiver 720 may, for example, be operable to amplify and/or down convert received wireless signals. In various aspects of the subject technology, the receiver 720 may be operable to cancel noise in received signals and may be linear over a wide range of frequencies. In this manner, the receiver 720 may be suitable for receiving signals in accordance with a variety of wireless standards such as Wi-Fi, WiMAX, BT, and various cellular standards. In various aspects of the subject technology, the receiver 720 may not use any sawtooth acoustic wave filters, and few or no off-chip discrete components such as large capacitors and inductors.

The transmitter 730 may comprise suitable logic circuitry and/or code that may be operable to process and transmit signals from the RF antenna 710. The transmitter 730 may, for example, be operable to upconvert baseband signals to RF signals and amplify RF signals. In various aspects of the subject technology, the transmitter 730 may be operable to upconvert and amplify baseband signals processed in accordance with a variety of wireless standards. Examples of such standards may include Wi-Fi, WiMAX, BT, and various cellular standards. In various aspects of the subject technology, the transmitter 730 may be operable to provide signals for further amplification by one or more power amplifiers. In some implementations, the transmitter 730 may implement the HD3 cancellation technique of the subject technology, as described above with respect to FIGS. 1, 2A, and 6 to benefit from the HD3 rejection capabilities of the disclosed technique.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer 712 may be operable in multiple frequency bands of various wireless standards.

The baseband processing module 740 may comprise suitable logic, circuitry, interfaces, and/or code that may be operable to perform the processing of baseband signals. The baseband processing module 740 may, for example, analyze received signals and generate control and/or feedback signals for configuring various components of the wireless communication device 700, such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may comprise suitable logic, circuitry, and/or code that may enable processing data and/or controlling operations of the wireless communication device 700. In this regard, the processor 760 may be enabled to provide control signals to various other portions of the wireless communication device 700. The processor 760 may also control the transfer of data between various portions of the wireless communication device 700. Additionally, the processor 760 may enable implementation of an OS or otherwise execute code to manage operations of the wireless communication device 700. In one or more implementations, the processor 760 may be interfaced with one or more transducer modules (not shown in FIG. 7) via host interface technologies such as an inter-integrated circuit ($I_2C$), a serial interface protocol (SPI), a peripheral component interconnect express (PCIE), a universal asynchronous receiver-transmitter (UART), and/or other interface technologies, depending on the data rate needed to sample and pipe from the transducers module to the processor 760.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various aspects of the subject technology, information stored in the memory 750 may be utilized for configuring the receiver 720 and/or the baseband processing module 740.

The LOGEN 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals, and/or sinusoidal signals. Characteristics of the oscillating signals, such as the frequency and duty cycle, may be determined based on one or more control signals from, for example, the processor 760 and/or the baseband processing module 740.

In operation, the processor 760 may configure the various components of the wireless communication device 700 based on a wireless standard according to which it is designed to receive signals. Wireless signals may be received via the RF antenna 710, amplified, and down converted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 700, data to be stored to the memory 750, and/or information affecting, and/or enabling operation of the wireless communication device 700. The baseband processing module 740 may modulate, encode, and perform other processing on audio, video, and/or control signals to be transmitted by the transmitter 730 in accordance with various wireless standards.

In some embodiments, a transmitter includes a LO generator circuit to generate a set of multiphase LO pulses, and a mixer circuit to mix a set of input data with the set of multiphase LO pulses. The duty cycle of each pulse of the set of multiphase LO pulses is adjustable to cause a first null to appear at a third harmonic frequency in a corresponding frequency spectrum of that pulse of the set of multiphase LO pulses.

In some implementations, the duty cycle of the pulse of the set of multiphase LO pulses is adjusted to within a range of 30-35% (e.g., approximately 33%).

In some implementations, the duty cycle of the pulse of the set of multiphase LO pulses is adjusted to within a range of 45-55% (e.g., approximately 50%).

In some implementations, the LO generator circuit includes a DLL circuit, and the duty cycle of the pulse of the set of multiphase LO pulses is adjusted to approximately 50%.

In some implementations, the DLL circuit generates a set of four-phase LO pulses with the duty cycle of about 33% and enable the mixer circuit to reject a third harmonic distortion (HD3) by about 20 dB.

In some implementations, the DDL circuit generates the set of four-phase LO pulses with the duty cycle of about 50% and enable the mixer circuit to improve the HD3 and a third counter intermodulation (CIM3).

In some implementations, the mixer circuit includes a digital four-phase in-phase (I) and quadrature (Q) mixer and is configured to use a set of four-phase LO pulses to improve an HD3 and a CIM3. In some embodiments, a four-phase I and Q mixer is a mixer that can mix I-data and Q-data with a set of four-phase LO pulses.

In some implementations, the set of input data includes a set of digital input data and includes digital I- and Q-data.

In some implementations, the set of multiphase LO pulses include a set of four-phase LO pulses with a phase difference of 90°.

In some implementations, the set of four-phase LO pulses include a 0-degree-phase I pulse, a 90-degree-phase Q pulse, a 180-degree-phase I pulse, and a 270-degree-phase Q pulse.

In some embodiments, a DLL circuit generates a set of multiphase pulses, and a circuit receives the set of multiphase pulses and a set of input data and generates an RF output signal. The DLL circuit adjusts duty cycles of the set of multiphase LO pulses to a predetermined value, and the circuit rejects an HD3 by utilizing the set of multiphase LO pulses with an adjusted duty cycle to the predetermined value.

In some implementations, the DLL circuit adjusts the duty cycles of the set of multiphase LO pulses to approximately 33% to enable improvement of the HD3 by about 20 dB.

In some implementations, the DLL circuit adjusts the duty cycles of the set of multiphase LO pulses to approximately 50% to enable improvement of the HD3 and the CIM3.

In some implementations, the circuit includes a mixer circuit and the set of input data includes digital I and Q data, and wherein the mixer circuit is configured to use a set of four-phase LO pulses to improve the HD3 and the CIM3.

In some embodiments, a communication device includes an LO generator circuit to generate a set of four-phase LO pulses with adjustable duty cycles, and a mixer circuit to mix a set of input data with the set of four-phase LO pulses. The LO generator adjusts the adjustable duty cycles to a predetermined value that causes a first null of a frequency spectrum of a pulse of the set of multiphase LO pulses to occur at a third harmonic frequency.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically stated, but rather "one or more." Unless specifically stated otherwise, the term "some" refers to one or more. Pronouns in the masculine (e.g., his) include the feminine and neuter gender (e.g., her and its), and vice versa. Headings and subheadings, if any, are used for convenience only, and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor is being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology, or that such aspect applies to all configurations of the subject technology. A disclosure relating to an aspect may apply to all configurations, or one or more configurations. A phrase such as an "aspect" may refer to one or more aspects, and vice versa. A phrase such as a "configuration" does not imply that such configuration is essential to the subject technology, or that such configuration applies to all configurations of the subject technology. A disclosure relating to a configuration may apply to all configurations, or one or more configurations. A phrase such as a "configuration" may refer to one or more configurations, and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known, or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise," as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. An apparatus, comprising:
a first circuit configured to generate multiphase pulses; and
a second circuit configured to mix a set of in-phase (I) data and quadrature (Q) data with the multiphase pulses,
wherein:
the multiphase pulses comprise multiple I pulses and multiple Q pulses each comprising a pulse having a duty cycle,
wherein the first circuit is configured to generate the multiphase pulses having the duty cycle such that a first null appears at a third harmonic frequency of the pulse, and
wherein the first circuit comprises a delay locked loop (DLL) configured to selectively produce adjusted duty cycle values of the multiphase pulses to be within 30-35% or within 45-55%.

2. The apparatus of claim 1, wherein the multiphase pulses comprise a set of four-phase LO pulses with the duty cycle within 30-35% such that the first null appears at the third harmonic frequency of the pulse to enable rejection of a third harmonic distortion (HD3).

3. The apparatus of claim 1, wherein the multiphase pulses comprise a set of four-phase LO pulses with the duty cycle within 45-55%.

4. The apparatus of claim 3, wherein the second circuit comprises a digital four-phase in-phase (I) and quadrature (Q) mixer and is configured to use the set of four-phase LO pulses.

5. The apparatus of claim 1, wherein the second circuit is further configured to mix the set of I-data and Q-data with the multiphase pulses to generate an output radio frequency (RF) signal.

6. The apparatus of claim 1, wherein the multiphase pulses comprise a set of four-phase LO pulses with a phase difference of 90 degrees.

7. The apparatus of claim 6, wherein the set of four-phase LO pulses include a 0-degree-phase I pulse, a 90-degree-phase Q pulse, a 180-degree-phase I pulse, and a 270-degree-phase Q pulse.

8. An integrated circuit, comprising:
a first circuit configured to generate a set of multiphase pulses with duty cycles; and
a second circuit configured to receive the set of multiphase pulses and reject a third harmonic distortion (HD3) of the set of multiphase pulses, wherein the multiphase pulses comprise multiple in-phase (I) pulses and multiple quadrature (Q) pulses each comprising a pulse having a duty cycle, and
the first circuit comprises a delay locked loop (DLL) configured to selectively produce adjusted duty cycle values of the multiphase pulses to be within 30-35% or within 45-55% to reject the HD3.

9. The integrated circuit of claim 8, wherein:
the set of multiphase pulses include a set of four-phase LO pulses, and wherein
the second circuit comprises a mixer circuit configured to use the set of four-phase LO pulses to reject the HD3 and a third counter intermodulation (CIM3) of the set of multiphase pulses.

10. The integrated circuit of claim 8, wherein the set of multiphase pulses comprise a set of four-phase LO pulses with a phase difference of 90 degrees.

11. The integrated circuit of claim 10, wherein the set of four-phase LO pulses include a 0-degree-phase I pulse, a 90-degree-phase Q pulse, a 180-degree-phase I pulse, and a 270-degree-phase Q pulse.

12. A communication device, comprising:
a first circuit configured to generate a set of four-phase LO pulses; and
a second circuit configured to mix in-phase (I) data and quadrature (Q) data with the set of four-phase LO pulses,
wherein the first circuit is further configured to generate the set of four-phase LO pulses with duty cycles such that a first null of a frequency spectrum of a pulse of the set of four-phase LO pulses occurs at a third harmonic frequency,
the four-phase LO pulses comprise multiple I pulses and multiple Q pulses each comprising a pulse having a duty cycle, and
the first circuit comprises a delay locked loop (DLL) configured to selectively produce adjusted duty cycle values of the four-phase LO pulses to be within 30-35% or within 45-55%.

13. The communication device of claim 12, wherein the second circuit comprises a digital four-phase in-phase (I) and quadrature (Q) mixer circuit and is configured to use the set of four-phase LO pulses to improve a third harmonic distortion (HD3) and a third counter intermodulation (CIM3) of the pulse of the set of four-phase LO pulses.

14. The communication device of claim 13, wherein the set of four-phase LO pulses include a 0-degree-phase I pulse, a 90-degree-phase Q pulse, a 180-degree-phase I pulse, and a 270-degree-phase Q pulse.

* * * * *